United States Patent [19]
Eitrheim

[11] Patent Number: 5,486,779
[45] Date of Patent: Jan. 23, 1996

[54] SENSE AMPLIFIER

[75] Inventor: John K. Eitrheim, Plano, Tex.

[73] Assignee: Cyrix Corporation, Richardson, Tex.

[21] Appl. No.: 367,035

[22] Filed: Dec. 29, 1994

[51] Int. Cl.⁶ ........................................ H03F 3/45
[52] U.S. Cl. .................. 327/51; 327/57; 327/80; 327/85
[58] Field of Search ............................ 327/51, 57, 80, 327/85

[56] References Cited

U.S. PATENT DOCUMENTS 4,972,102  11/1990  Reis et al. ............................... 307/451
5,034,636  7/1991  Reis et al. ............................... 307/530
5,079,745  1/1992  Ito et al. ................................. 365/207
5,189,322  2/1993  Chan et al. ............................. 307/530

FOREIGN PATENT DOCUMENTS 4195998  7/1992  Japan .

*Primary Examiner*—Margaret Rose Wambach
*Attorney, Agent, or Firm*—John L. Maxin; Andrew S. Viger

[57]    ABSTRACT

An improved sense amplifier is disclosed employing bleeder and dampening devices coupled in a robust feedback configuration for maintaining a relatively narrow and stable voltage level above the high threshold of the sense amplifier.

18 Claims, 3 Drawing Sheets

5,486,779

1

SENSE AMPLIFIER

BACKGROUND OF THE INVENTION

1. Field of the Invention

The invention relates generally to sense amplifiers, and more particularly to a sense amplifier having improved speed and noise margin characteristics.

2. Description of Related Art

Sense amplifiers are used in a number of digital circuitry applications to speed-up the transition time between changes in logic levels. For the most part, this is accomplished by compressing input levels to just above or below the switch point of a sensing inverter. The swing or "slew" of the input therefore need not be as large to trigger the inverter to switch logic states. This level "compression" however is not without limitations.

FIG. 1 depicts a typical prior art sense amplifier 10 having an input node 14 coupled to receive logic input signals from an N-channel MOSFET logic tree 12. The input node 14 is coupled to the sources of load P-channel transistor 28 and fast recovery N-channel transistor 36, and to an input on sensing inverter 32. An output on inverter 32 drives the gate of fast recovery transistor 36, an input on feedback inverter 30, and em input on output driver inverter 34. An output on feedback inverter 30 drives the gate of load transistor 28. The drains of load transistor 28 and fast recovery transistor 36 are coupled to the supply voltage $V_{DD}$. The output voltage on driver inverter 34 swings substantially between ground and $V_{DD}$ to restore logic levels to their normal amplitudes.

A limitation with the sense amplifier 10 depicted in FIG. 1 is the magnitude and fall time of the steady state high level on the input to sense inverter 32 (node 14). This point is best illustrated with reference to FIG. 2. At time zero, waveform 44 (which is the gate voltage of one or more of the plurality of transistors in logic tree 12) is depicted as being high thus pulling down the voltage on input node 14 (represented as waveform 46). As waveform 44 is driven low at point 15, logic tree 12 begins to cease sinking current allowing voltage waveform 46 to be pulled up through transistors 28 and 36 to $V_{DD}$. As waveform 46 increases and crosses switch point 52 of inverter 32 at point 19, the output of inverter 32 (represented as waveform 48) begins to go low turning off transistor 36 and driving feedback inverter 30 high which turns off load transistor 28. This leaves node 14 in a high impedance state suspect to leakage, reducing the noise margin of the sense amplifier, making operation less reliable.

The output of driver inverter 34 (represented by waveform 50) swings from the negative voltage rail (ground) to substantially the positive voltage rail ($V_{DD}$) to restore logic levels to their appropriate magnitude. The steady state input to inverter 32 a.k.a. node 14 (waveform 46) levels off to a variable (depicted as dashed) high level voltage 56 subject to leakage, variations in the switch point 52 of inverter 32, and the variable delay induced by inverters 30 and 32 and transistors 28 and 26, all of which are subject to changes in process technology.

As waveform 44 is driven high at point 17, logic tree 12 begins to sink current through transistors 28 and 36 pulling waveform 46 on input node 14 below switch point 52 of inverter 32 at point 21. Waveform 48 (the output of inverter 32) then begins to go high turning on transistor 36 and driving the output of feedback inverter 30 low which turns on load transistor 28. Also in response to waveform 48 going

2 high, waveform 50 (the output of inverter 34) goes low. The response time it takes output waveform 50 to fully respond to the change in input waveform 44 at point 17 is depicted as $t_1$.

It can be seen from the foregoing that without jeopardizing noise margin characteristics, it is desirable to reduce the steady state level above the switch point of the sensing inverter thus reducing $t_1$, to improve the sense amplifier switching speed.

SUMMARY OF THE INVENTION

To overcome the limitations of the prior art described above, and to overcome other limitations that will become apparent upon reading and understanding the present specification, the present invention discloses a sense amplifier with improved speed and noise margin characteristics employing a bleeder and dampening device coupled in a robust feedback configuration to maintain a relatively narrow and stable steady state high level above the switch point of sensing logic circuitry.

A feature of the present invention is maintaining a narrow high level point above the logic switch point to accelerate the switching speed without compromising noise immunity.

This and various other objects, features, and advantages of novelty which characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a specific example of an improved sense amplifier practiced in accordance with the present invention.

DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Figure 3:
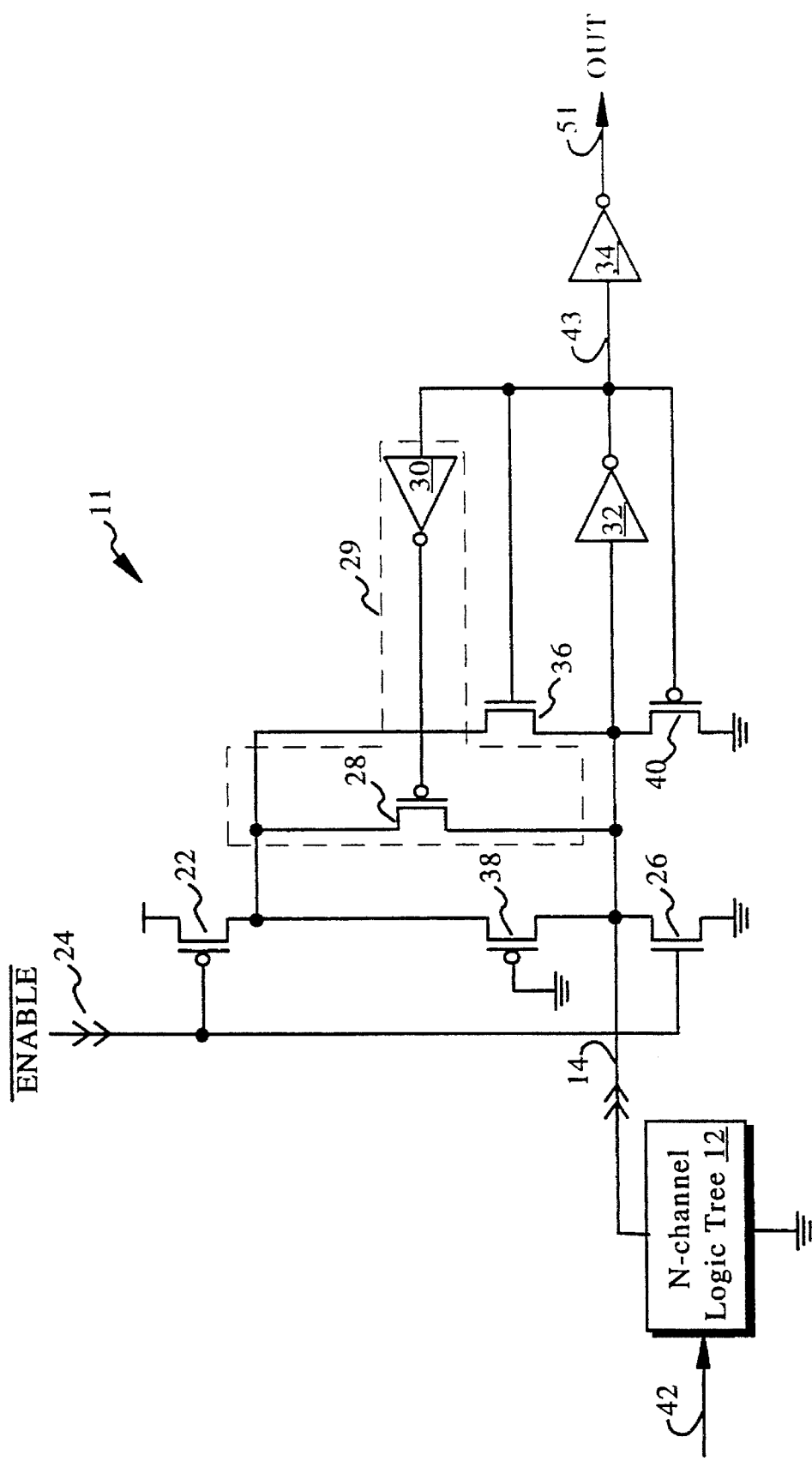
FIG. 3 is a schematic diagram of a sense amplifier practiced in accordance with the principles of the present invention; and, FIG. 4 is a timing diagram of waveforms occurring at selected nodes within the schematic illustrated in FIG. 3.

Referring now to FIG. 3, an improved sense amplifier 11 is depicted in accordance with the principles of the present invention. Unless otherwise specified, the MOS transistors described hereinbelow are preferably enhancement mode IGFETs. An N-channel logic tree 12 comprising a plurality of N-channel transistors with commonly coupled drains, sinks current to the negative voltage rail (ground) from an input node 14 on the sense amplifier 11. A P-channel transistor 22 has its source coupled to the positive voltage rail ($V_{DD}$), its gate coupled to an active low enable input 24, and its drain to the sources of P-channel transistors 38 and 28 and to the drain of N-channel transistor 36. It should be understood that the combination of P-channel transistor 28 and inverter 30 could be replaced with an N-channel depletion mode transistor (depicted as dashed 29) without departing from the scope of the present invention.

An N-channel transistor 26 has its drain coupled to input node 14, its source to ground, and its gate to the active low enable input 24. When the sense amplifier 11 is disabled (i.e. the active low enable input 24 is pulled near $V_{DD}$), transistor 26 is turned on pulling input node 14 to ground and transistor 22 is turned off cutting off $V_{DD}$ to the remaining circuitry in the sense amplifier 11.

The primary load device, P-channel transistor 28, has its source coupled to $V_{DD}$ through transistor 22, its drain coupled to the input node 14, and its gate coupled to the output of feedback inverter 30. With the aid of the present disclosure, those skilled in the art will recognize other load devices, such as, but not limited to, depletion mode MOS transistors (e.g. transistor 29 depicted by a dashed box) and poly-resistors, without departing from the scope of the present invention. Fast recovery N-channel transistor 36 has its drain coupled to $V_{DD}$ through transistor 22, its source coupled to input node 14, and its gate to the output of sense inverter 32. Inverter 32 has its input coupled to input node 14 and its output coupled to the input on feedback inverter 30, the gate on N-channel transistor 36, and to the input on output driver inverter 34. The output of driver inverter 34 provides logic compatible voltage swings. Dampening P-channel transistor 40 has its source coupled to the input node 14, its drain to the negative voltage rail (ground), and its gate coupled to the output of inverter 32. Bleeder P-channel transistor 38 has its gate coupled to ground, its source coupled to $V_{DD}$ through P-channel transistor 22, and its drain coupled to input node 14. With the aid of the present disclosure, those skilled in the art will recognize other bleeder and dampening devices, such as, but not limited to, depletion mode MOS transistors and poly-resistors, without departing from the scope of the present invention.

Figure 1:
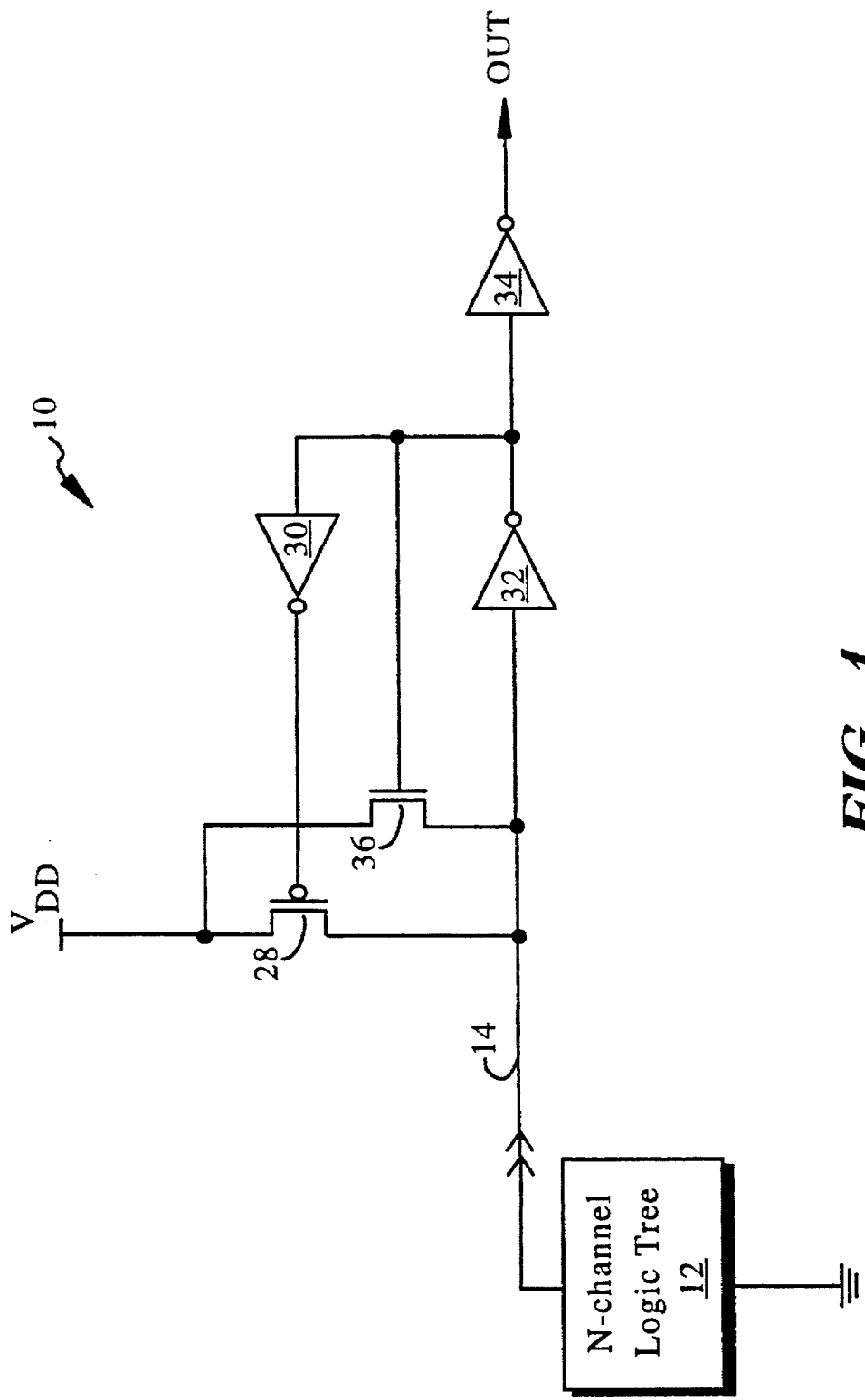
FIG. 1 is a schematic diagram of a typical prior art sense amplifier.
Figure 2:
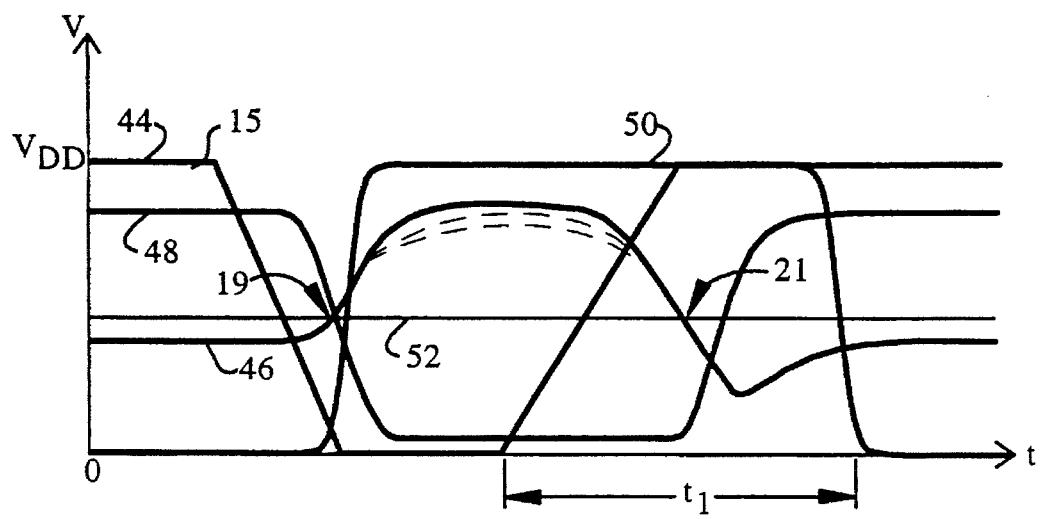
FIG. 2 is a timing diagram of waveforms occurring at selected nodes within the schematic illustrated in FIG. 1.
Figure 4:
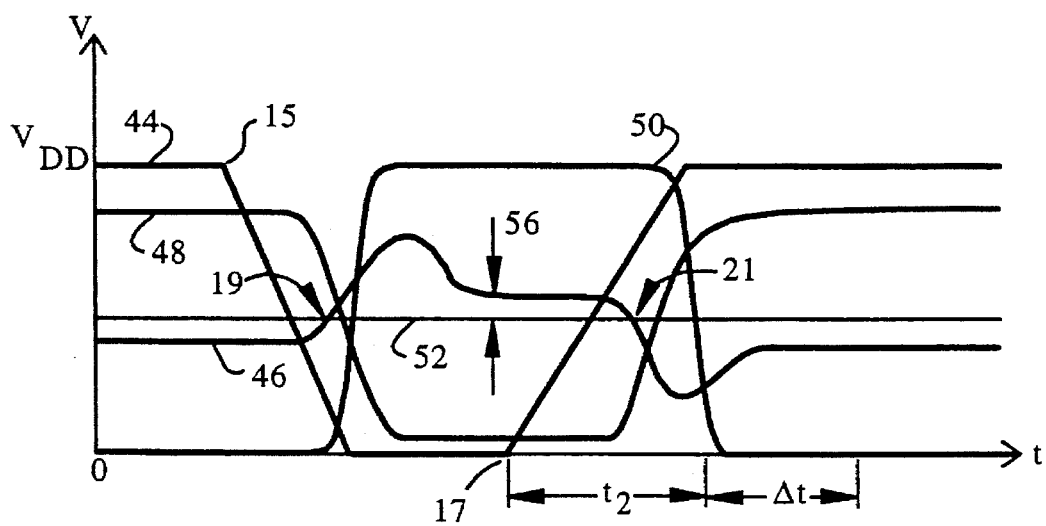

The operation of bleeder transistor 38 and dampening transistor 40 is best understood with reference to FIG. 4 which depicts a timing diagram of selected signals found on nodes in FIG. 3. At time zero, waveform 44 (the gate voltage of one or more of the plurality of transistors in logic tree 12) is depicted high thus pulling down the voltage on input node 14 (represented as waveform 46). As waveform 44 is driven low at point 15, logic tree 12 begins to cease sinking current allowing voltage waveform 46 to rise up on input node 14. As waveform 46 crosses switch point 52 of inverter 32 at point 19, the output of inverter 32 begins to go low (represented as waveform 48) turning transistor 36 off, turning transistor 40 on, and driving feedback inverter 30 high which turns off load transistor 28. Since transistors 28 and 36 are turned off at this point, bleeder transistor 38 supplies current from $V_{DD}$ through transistor 22 to transistor 40. The energized dampening transistor 40 provides an impedance to ground and thus dampens waveform 46 by forming knee 54 limiting the overshoot and pulling the steady state high level voltage 56 closer to switch point 52. The bleeder transistor 38 and dampening transistor 40 thus maintain a relatively narrow and stable steady state high level voltage above the switch point 52.

The time ($t_2$) it takes output waveform 50 to fully respond to input waveform 44 is significantly shorter (by $\Delta_t$) than time $t_1$ due to bleeder resistor 38 actively pulling input node 14 to $V_{DD}$ and bleeder transistor 40 dampening the overshoot. The overshoot of knee 54 and the magnitude of the steady state high level 56 in FIG. 4 can be adjusted by changing the gain (channel widths and lengths) of transistors 38 and 40.

CONCLUSION

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the claims.

What is claimed is:

1. A sense amplifier comprising:
   (a) sense means, coupled to receive input signals, for sensing logic levels and providing an output in response thereto;
   (b) feedback means, coupled to the output of the sense means, for providing feedback to the sense means;
   (c) load means, coupled between a positive voltage rail and the sense means and controlled by the feedback means, for selectively supplying current to the sense means;
   (d) bleeder means, coupled in parallel with the load means, for supplying a weak current to the sense means; and,
   (e) dampening means, coupled between the sense means and a negative voltage rail and controlled by the sense means, for dampening a response of the sense means to the input signals.

2. A sense amplifier as recited in claim 1 wherein the sense means is an inverter.

3. A sense amplifier as recited in claim 1 wherein the feedback means is an inverter.

4. A sense amplifier as recited in claim 1 wherein the load means is a MOSFET transistor.

5. A sense amplifier as recited in claim 4 wherein the MOSFET transistor is a depletion mode transistor.

6. A sense amplifier as recited in claim 1 wherein the bleeder means is a MOSFET transistor.

7. A sense amplifier as recited in claim 1 wherein the dampening means is a MOSFET transistor.

8. A sense amplifier as recited in claim 1 further comprising:
   (f) disabling means, coupled between the positive voltage rail and the load means, for disabling the sense amplifier into a low power state.

9. A sense amplifier comprising:
   (a) a sense inverter having an input coupled to receive input signals and an output to indicate logic levels of the input signals;
   (b) an output inverter having an input coupled to receive output signals from the sense inverter and an output to provide logic compatible swings;
   (c) a feedback inverter having an input coupled to the output of the sense inverter and an output coupled to the input of the sense inverter;
   (d) a load device coupled between a positive voltage rail and the input to the sense inverter and controlled by the feedback inverter, to selectively supplying a current to the input on the sense inverter;
   (e) a bleeder device, coupled in parallel with the load device, to supply a weak current to the input on the sense inverter; and, (f) a dampening device, coupled between the input on the sense inverter and a negative voltage rail and controlled by the output of the sense inverter, to dampen input signals to the sense inverter.

10. A sense amplifier as recited in claim 8 wherein the load device is a MOSFET transistor.

11. A sense amplifier as recited in claim 10 wherein the MOSFET transistor is an enhancement mode MOSFET transistor.

12. A sense amplifier as recited in claim 8 wherein the bleeder device is a MOSFET transistor.

13. A sense amplifier as recited in claim 8 wherein the dampening device is a MOSFET transistor.

14. A sense amplifier as recited in claim 8 wherein the bleeder device is a enhancement mode MOSFET transistor.

15. A sense amplifier as recited in claim 8 wherein the dampening device is a enhancement mode MOSFET transistor.

16. A sense amplifier as recited in claim 8 further comprising a disabling device coupled between the positive voltage rail and the load device to disable the sense amplifier into a low power state.

17. A sense amplifier as recited in claim 15 further comprising a transistor coupled between the negative voltage rail and the input of the sensing inverter, and responsive to the disabling device, to pull the input of the sensing inverter to the negative voltage rail.

18. A method of sensing logic levels with a sense amplifier comprising the steps of:

(a) sensing an input signal and providing an output in response thereto indicating a logic level;

(b) feeding back a current to the input signal in response to the output in the step of sensing the input signal;

(c) supplying a weak bleeder current to the input signal in parallel with the current in the step of feeding back the current; and, (d) in response to a logic level low to high change on the input signal in the step of sensing the input signal, dampening the current in the step of feeding back the current.

\* \* \* \* \*